(12) United States Patent
Duijndam

(10) Patent No.: US 11,061,098 B2
(45) Date of Patent: Jul. 13, 2021

(54) PHASE ERROR CORRECTION FOR BIPOLAR READ OUT GRADIENTS

(71) Applicant: KONINKLIJKE PHILIPS N.V., Eindhoven (NL)

(72) Inventor: Adrianus Joseph Willibrordus Duijndam, Nijmegen (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/485,484

(22) PCT Filed: Feb. 9, 2018

(86) PCT No.: PCT/EP2018/053237
§ 371 (c)(1),
(2) Date: Aug. 13, 2019

(87) PCT Pub. No.: WO2018/149737
PCT Pub. Date: Aug. 23, 2018

(65) Prior Publication Data
US 2020/0018809 A1    Jan. 16, 2020

(30) Foreign Application Priority Data

Feb. 17, 2017   (EP) .................................. 17156616

(51) Int. Cl.
*G01R 33/565* (2006.01)
*G01R 33/48* (2006.01)
(Continued)

(52) U.S. Cl.
CPC ... *G01R 33/56554* (2013.01); *G01R 33/4828* (2013.01); *G01R 33/5616* (2013.01); *G01R 33/56341* (2013.01)

(58) Field of Classification Search
CPC .......... G01R 33/56554; G01R 33/4828; G01R 33/5616; G01R 33/56341; G01R 33/56518
See application file for complete search history.

(56) References Cited

U.S. PATENT DOCUMENTS

| 6,515,476 B1 | 2/2003 | Oshio et al. |
| 10,234,522 B2 | 3/2019 | Eggers |

(Continued)

FOREIGN PATENT DOCUMENTS

| JP | 07194576 A | * 8/1995 | ............. A61B 5/055 |
| WO | 2016207035 A1 | 12/2016 | |

OTHER PUBLICATIONS

Yu et al "Phase and Amplitude Correction for Multi-Echo Water-Fat Separation With Bipolar Acquisitions " J. of Magnetic Resonance Imaging 31 p. 1264-1271 (2010).

(Continued)

*Primary Examiner* — Susan S Lee

(57) ABSTRACT

A magnetic resonance (MR) imaging system includes a memory for storing machine executable instructions and preparation pulse sequence commands. The preparation pulse sequence commands are configured to control the system to acquire the preliminary MR data as a first data portion and a second data portion; to generate a first bipolar readout gradient during acquisition of the first portion; and to generate a second bipolar readout gradient during acquisition of the second portion, wherein the first bipolar readout gradient has an opposite polarity to the second bipolar gradient. The system is further configured to calculate a measured normalised phase correction quantity in image space using the first and second data portions; and fit a modeled phase correction to the measured phase error, wherein modeled phase correction is an exponential of a (Continued)

complex value multiplied by a phase error function that is spatially dependent.

15 Claims, 7 Drawing Sheets

(51) Int. Cl.
  *G01R 33/561* (2006.01)
  *G01R 33/563* (2006.01)

(56) References Cited

U.S. PATENT DOCUMENTS

| | | |
|---|---|---|
| 2014/0232393 A1 | 8/2014 | Wheaton et al. |
| 2015/0161784 A1 | 6/2015 | Ma |
| 2015/0316631 A1 | 11/2015 | Ma et al. |
| 2016/0187447 A1 | 6/2016 | Hwang et al. |
| 2017/0108571 A1 | 4/2017 | Jurrissen et al. |

OTHER PUBLICATIONS

H. Eggers et al "Phase and Amplitude Correction in Bipolar Multi-Gradient Echo Water-Fat Imaging" Proceedings of the International Society for Magnetic Resonance in Medicine, 16th Annual Meeting . . . vol. 16, Apr. 19, 2008 p. 1364.

Li Jianqi et al "Phase Corrected Bipolar Gradients in Multi-Echo Gradient Echo Sequences for Quantitative Susceptibility Mapping" Mag. Reson Materials in Physics, Biology and Medicine, vol. 28, No. 4 Nov. 20, 2014 p. 347-355.

Pernilla Peterson et al Fat Quantification Using Multiecho Sequences With Bipolar Gradients: Investigation of Accuracy and Noise Performance, Magnetic Resonance in Med. vol. 71, No. 1, Feb. 14, 2013 p. 219-229.

Holger Eggers et al "Dual-Echo Dixon Imaging With Flexible Choice of Echo Times" Magnetic Resonance in Medi, 2010 vol. 65, No. 1, Sep. 21, 2010 p. 96-107.

D. Hernando et al., "Addressing Phase Errors in Fat-Water Imaging Using a Mixed Magnitude/Complex Fitting Method" Magnetic Resonance in Medicine, 67 p. 638-644 (2012).

International Search Report from PCT/EP2018/053237 dated May 29, 2018.

\* cited by examiner

US 11,061,098 B2

PHASE ERROR CORRECTION FOR BIPOLAR READ OUT GRADIENTS

CROSS REFERENCE TO RELATED APPLICATIONS

This application is a U.S. national phase application of International Application No. PCT/EP2018/053237 filed on Feb. 9, 2018, which claims the benefit of EP Application Serial No. 17156616.9 filed on Feb. 17, 2017 and is incorporated herein by reference.

TECHNICAL FIELD

The invention relates to magnetic resonance imaging, in particular to the correction of phase errors in magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the $B_0$ field.

During an MRI scan, Radio Frequency (RF) pulses generated by a transmitter coil cause perturbations to the local magnetic field, and RF signals emitted by the nuclear spins are detected by a receiver coil. These RF signals are used to construct the MRI images. These coils can also be referred to as antennas. Further, the transmitter and receiver coils can also be integrated into a single transceiver coil that performs both functions. It is understood that the use of the term transceiver coil also refers to systems where separate transmitter and receiver coils are used. The transmitted RF field is referred to as the $B_1$ field.

MRI scanners are able to construct images of either slices or volumes. A slice is a thin volume that is only one voxel thick. A voxel is a small volume over which the MRI signal is averaged, and represents the resolution of the MRI image. A voxel may also be referred to as a pixel herein.

Dixon methods of magnetic resonance imaging include a family of techniques for producing separate water and lipid (fat) images. The various Dixon techniques such as, but not limited to, two-point Dixon Method, three-point Dixon method, four-point Dixon method, and six-point Dixon Method are collectively referred to herein as Dixon techniques or methods. The reconstruction of the water and fat images relies on the accurate determination of the phase error to prevent phase wrapping.

The journal article Yu et. al., "Phase and Amplitude Correction for Multi-Echo Water-Fat Separation With Bipolar Acquisitions," J. of Magnetic resonance imaging 31:1264-1271 (2010) discloses a method of calculating two-dimensional phase errors using preliminary magnetic resonance data acquired with bipolar gradients.

SUMMARY OF THE INVENTION

The invention provides for a magnetic resonance imaging system, a computer program product and a method in the independent claims. Embodiments are given in the dependent claims.

When performing magnetic resonance imaging, there may be phase errors which are introduced due to induced eddy currents and other imperfections in the magnetic resonance imaging system. When gradients of a single polarity are used, these phase errors tend to result in an offset or linear offset. However if bipolar gradients are used the phase errors may also be dependent upon the polarity of the gradient, resulting in a phase error that is no longer an offset. In some cases, the phase errors may be doubled. This can be tricky, because the phase repeats its self as a function of $2\pi$ radians. When performing imaging techniques such as a Dixon magnetic resonance imaging protocol making a mistake in the phase can result in water or fat regions being improperly identified resulting in an image artifact commonly referred to as a fat/water swap.

The invention concerns the correction of magnetic resonance signals for phase errors that may be due to eddy currents and imperfections of the magnetic field homogeneity. In particular, the correction of the invention applies to bipolar gradient read-out where the phase error is not a simple phase offset. The correction is obtained from measured phase errors that are fit to a modeled phase correction. The correction of the invention finds application in Dixon water-fat separation techniques that make use of the bipolar gradient read-outs. The invention includes to employ preliminary MR data. These preliminary MR data serve to obtain the phase correction. That is, the present invention makes available the phase correction to correct e.g. for eddy-current effects in subsequently acquired MR image data. Typically, the measured preliminary data are acquired at zero of low-value phase-encodings, for example at $k_y=k_z=0$ or at small values of $k_y$, $k_z$, such that $k_y<k_{y,max}$, $k_z<k_{z,max}$ where the maximum values $k_{y,max}$ and $k_{z,max}$ may be set by the user or may be pre-set values. The preliminary MR data are acquired by a preparation pulse sequence which generates bipolar read outs of opposite polarity of the bipolar gradient lobes. The measured preliminary data for the positive and negative polarity gradient lobes, respectively satisfy $p_c^{\pm}(x)=p_c(x)e^{\pm i\varphi(x)}$, where usual the imaginary number i is the square root of $-1$.

where $\varphi(x)$ is the spatially dependent phase error due to eddy current effects and magnetic field inhomogeneities so that the normalised phase correction quantity $$y(x) = \frac{p2, \text{corr}(x)}{|p2, \text{corr}(x)|},$$

with $p_{2,corr}(x)$ being a correlation between the data from the positive and negative gradient read-out lobes and which is related to the phase error in a simple manner:

$$p_{2,corr}(x) \equiv \frac{p_x^-(x)p_x^+(x)^*}{|p_x^+(x))|} = p_c(x)e^{-2i\varphi(x)}.$$

Hence, the normalised phase correction quantity y(x) represents the phase error, in that the normalised phase correction quantity is in fact the phasor of twice the phase error: $y(x)=e^{-i\varphi(x)}$. The normalised phase correction quantity y(x) is obtained from the measured data and may be fit to a predetermined phase error function $\Phi(a; x)$, where the vector a contains the adjustable parameters $a_1, \ldots a_N$ that characterise the predetermined phase error function. The phase error may now be estimated from a minimization problem $$\tilde{a} = \min_a \left[ \sum_i |y(x_i) - e^{2i\Phi(a;x_i)}|^2 \right],$$

where the summation runs over a set of spatial positions. This achieves to filter on the spatially slowly varying component of the phase error and phase wrap errors are filtered out. The minimization may also be carried-out using a different metric than the quadratic form.

Further, for a multi-channel RF receiver system, the measured phase error (ideally) is equal for all channels. Hence, the signal-to-noise ration of the phase error quantity y(x) may be improved by averaging over channels.

In a practical implementation that predetermined phase error function is an N-th degree polynomial:

$$\Phi(a; x) = \sum_{k=0}^{N} a_k x^k$$

Accordingly, from the preliminary magnetic resonance data with first and second data portions form the respective bipolar read-outs with opposite polarities, the optimum parameters for the predetermined phase error function are calculated. This is then used to compute the estimate of the phase error that may be employed for phase corrections in subsequent acquisition of MR image data, which may involve a Dixon type water-fat separation. The parametrised predetermined phase error function represents a model for the phase error.

The phase error function is a smooth fit function (parameterised) to the data over the full (>2π) phase range of the phase-value of the acquired data. Further aspects (optional) of the parameterised phase error function are: $C^n$-differentiability (n>2), Nth(>2) polynomial, or a superposition of goniometric functions.

The invention enables to do a successful water fat separation that is less susceptible of erroneous phase wrapping. Accordingly, the invention achieves to avoid erroneous water-fat swaps even in difficult situation of e.g. overhanging fat slabs, e.g. in an overhanging thoracic wall, a coronal scan in the abdomen with left-right read-out direction and in the head-neck region with feet-head read-out direction.

Embodiments may provide for an improved method of calculating the phase error by fitting the measured normalised phase correction quantity to the modeled phase error function. The modeled phase correction is represented as a phasor of the phase error function. In the fitting process the values of the phase error function are modified such that the modeled phase correction is fit to the normalised phase correction quantity, i.e. to the measured phase error. Because the phase error function is within the exponential the proper phase is automatically selected. When performing Dixon imaging it may automatically reduce or eliminate fat/water swaps. For example, the invention enables to do a successful water fat separation that is less susceptible of erroneous phase wrapping. Accordingly, the invention achieves to avoid erroneous water-fat swaps even in difficult situation of e.g. overhanging fat slabs, e.g. in an overhanging thoracic wall, a coronal scan in the abdomen with left-right read-out direction and in the head-neck region with feet-head read-out direction.

In one aspect, the invention provides for a magnetic resonance imaging system for acquiring preliminary magnetic resonance data from an imaging zone. The magnetic resonance imaging system comprises a memory for storing machine-executable instructions and pulse sequence commands. Pulse sequence commands as used herein encompass commands or data which may be converted into commands which are used for controlling the operation and function of a magnetic resonance imaging system to acquire magnetic resonance data. Preparation pulse sequence commands are pulse sequence commands. Imaging pulse sequence commands are pulse sequence commands. "Preparation" and "imaging" are labels used to distinguish different groups of pulse sequence commands.

The preparation pulse sequence commands are configured for controlling the magnetic resonance imaging system to generate two bipolar readout gradients during acquisition of the preliminary magnetic resonance data. A first bipolar readout gradient is used during the readout of a first data portion of the preliminary magnetic resonance data and a second bipolar readout gradient is used during the readout of a second data portion of the preliminary magnetic resonance data. In many cases the first bipolar readout gradient and the second bipolar readout gradient are equivalent but have opposite values or polarities.

The magnetic resonance imaging system further comprises a processor for controlling the magnetic resonance imaging system. Execution of the machine-executable instructions causes the processor to control the magnetic resonance imaging system with the preparation pulse sequence commands to acquire the first data portion and the second data portion. Execution of the machine-executable instructions further causes the processor to calculate a measured phase error in image space using the first data portion and the second data portion. In image space there will be a spatially dependent phase error. For the opposite gradient polarities the phase error will have opposite values. The measured phase error may therefore be calculated from the images generated from the first data portion and the second data portion.

Execution of the machine-executable instructions further cause the processor to fit a model phase error function to the measured phase error. In the fit procedure the phasor of the model phase error function is fit to the normalised phase correction quantity. The phase error function is spatially dependent.

This embodiment may have the advantage that it provides for an automatic and effective way of correctly calculating the phase error. Normally fairly complicated algorithms are used to decide which phase region the images are in. By having the phase error as a function of an exponential multiplied by a complex value this difference in the phase is automatically calculated during the fitting process.

The above embodiment is described in detail with respect to a three point Dixon method. These data obtained (the first data portion and the second data portion) from the two bipolar sequences may include:

the first data portion, a bipolar sequences with 3 echoes (the + and − signs indicate the gradient direction): p+(echo=1), p−(echo=2) and p+(echo=3)

Second data portion: a bipolar sequences with 3 echoes: p−(echo=1), p+(echo=2) and p−(echo=3). Note that the polarities in this second portion are reversed with respect to the first data portion.

Now for each echo independently, the phase errors are derived, using the technique described, using the + and − signals, for example for echo 2: p−(echo=2) from the first data portion and p+(echo=2), from the second data portion.

As a side point: typically these data are only measured for $k_y = k_z = 0$, and the phase correction is a function of x (readout-direction) only.

During the acquisition of the normal (diagnostic) data only one bipolar readout gradient, in this case for three echoes: p+(echo=1), p−(echo=2) and p+(echo=3). Each of these echoes are corrected with their "own" correction signal. This may be repeated for all ky and kz values.

In another embodiment execution of the machine-executable instructions further cause the processor to reconstruct measured first phase image data using the first data portion and reconstruct measured second phase image data using the second data portion. The measured first phase image data and the measured second phase image data may either be images of the spatially dependent phase or data which is descriptive of the phase as a function of two- or three-dimensional position. The measured first phase image data is equal to corrected first phase image data multiplied by the phasor of the measured phase error. The measured second phase image data is equal to corrected second phase image data multiplied by the phasor of the complex conjugate of the measured phase error. The measured normalised phase correction quantity is calculated by solving the measured first phase image data and the measured second phase image data for the measured phase error. This embodiment may be beneficial because it provides a means of determining the measured phase error correction from the measured first phase image data and the measured second phase image data.

The solving for the measured phase error may be done in several different ways. In one example the measured phase error is calculated by dividing the product of the complex conjugate of the measured first phase image data by the measured second phase image data by the magnitude of either the measured first phase image or the measured second phase image, thus forming the normalised phase correction quantity.

Another means of calculating the measured phase error is to take the geometric mean of the magnitude of the phase of the measured first phase image and the measured second phase image data.

In another embodiment the magnetic resonance imaging system comprises a multiple channel radio-frequency system comprising multiple channels for receiving the preliminary magnetic resonance data. The measured phase error is calculated from an average of each of the multiple channels. In this embodiment the phase images or data are corrected for each channel and these are then used to solve for a phase error function for each individual channel that is spatially dependent. Then, once this is determined, the spatially dependent phase error is averaged over all the multiple channels. This embodiment may be beneficial because it may provide for a means of accurately calculating the measured phase error from the measured MR data.

In another embodiment execution of the machine-executable instructions further cause the processor to reconstruct a first phase image using the first data portion. Execution of the machine-executable instructions further causes the processor to reconstruct a second phase image using the second data portion. The measured normalised phase correction quantity is calculated using the first phase image and the second phase image.

In another embodiment the magnetic resonance imaging system comprises a multiple channel radio-frequency system comprising multiple channels for receiving the magnetic resonance imaging system using the multiple receive channels. Execution of the machine-executable instructions further cause the processor to reconstruct a first phase image using the first data portion for each of the multiple channels. Execution of the machine-executable instructions further cause the processor to reconstruct a second phase image using the second data portion for each of the multiple channels. Execution of the machine-executable instructions further cause the processor to calculate a channel normalised phase correction quantity using the first phase image and the second phase image for each of the multiple channels. The measured normalised phase correction quantity is calculated using an average of the channel normalised phase correction quantity from each of the multiple channels. This embodiment may be beneficial because it provides a means for calculating the measured normalised phase correction quantity more accurately and at higher signal-to-noise ratio by averaging it over all of the various receive channels.

In another embodiment the memory further comprises imaging magnetic resonance commands. The imaging pulse sequence commands are further configured for acquiring imaging magnetic resonance data according to a Dixon magnetic resonance imaging protocol. The Dixon magnetic resonance imaging protocol may use bipolar gradients for acquiring the imaging magnetic resonance data. In Dixon magnetic resonance imaging protocols magnetic resonance data is acquired at a variety of phases to separate the portion of the image that comes from predominantly fat from predominantly water. Execution of the machine-executable instructions further cause the processor to calculate at least a water image and the fat image according to the Dixon magnetic resonance imaging protocol using the preliminary magnetic resonance data. The calculation of the water image and the fat image comprises calculating a phase correction using the phase error function. This embodiment may be very beneficial because when performing various Dixon methods proper calculation of the phase correction is important to properly identify a region as either being fat or water. If this is done incorrectly there can be horrible artifacts which are introduced into the water image and/or the fat image. The correction of the phase error as a fitting process to a predetermined parametrised phase error function as described as an embodiment above eliminates or may reduce the chances of such artifacts being formed in a Dixon image.

In another embodiment memory further comprises imaging magnetic resonance commands. The imaging pulse sequence commands are further configured for acquiring the imaging magnetic resonance data according to an echo planar imaging magnetic resonance protocol. Execution of the machine executable instructions further causes the processor to reconstruct a magnetic resonance image using the imaging magnetic resonance data. Reconstructing the magnetic resonance image comprises calculating a phase correction using the phase error function.

In another embodiment the memory further comprises imaging magnetic resonance commands. The pulse sequence commands are further configured for acquiring the imaging magnetic resonance data according to a diffusion weighted imaging magnetic resonance protocol. Execution of the machine executable instructions further causes the processor to reconstruct a magnetic resonance image using the imaging magnetic resonance data. Reconstructing the magnetic resonance image comprises calculating a phase correction using the phase error function.

In diffusion weighted imaging protocols the bipolar gradients are used to encode the position of spins before they move. This may for example be used for imaging flow or diffusion of fluids through a subject. This embodiment may provide for an improved way of performing diffusion weighted imaging.

The various types of magnetic resonance imaging data may be acquired using bipolar gradient read-outs that are equal to those of the acquisition of the preliminary magnetic resonance data. Then the phase correction found by the fit procedure from the preliminary magnetic resonance data may be directly employed for the phase correction of the magnetic resonance imaging data. When different bipolar gradient read-out strengths or different gradient pulse rates are employed in the preparation pulse sequence and in the acquisition of the imaging magnetic resonance data, the phase correction obtained from the fit procedure from the preliminary magnetic resonance data needs to be converted to apply to the imaging magnetic resonance data. This conversion may be based on scaling properties of the phase error with the waveform aspects (including gradient strengths and pulse rates) of the bipolar read out. Alternatively, the conversion may be based on a separate calibration of the way the phase correction depends on these waveform aspects.

In another embodiment the bipolar readout gradient comprises a pulse train comprising the first polarity portion and the second polarity portion multiple times. The phase error function is calculated as an average over the pulse train. This embodiment may be beneficial because it may provide for more accurate determination of the model phase error function.

In another embodiment the phase error function is real value and the phase error function s continuous. This may be beneficial because it may provide for a means of effectively fitting the phase error function.

In another embodiment the phase error function has a continuous first derivative.

In another embodiment the phase error function is a polynomial function. The use of the polynomial function has in experiments proved to be extremely useful. The polynomial functions do an effective job of modeling the correct phase error while providing for a limited number of values which need to be modified during the fitting process. It provides for an accurate and computationally effective means of effectively calculating the model phase error function.

In another embodiment the preparation pulse sequence commands are configured for causing the magnetic resonance imaging system to generate the bipolar readout gradient in a readout direction. The phase error function is calculated at least as a function of the readout direction.

In another embodiment the phase error function is a multi-dimensional function. The phase error may be due to eddy currents and other effects which may not necessarily be in the readout direction. It may therefore be beneficial to calculate the phase error function as a function of more than one dimension.

In another aspect the invention provides for a method of operating the magnetic resonance imaging system for acquiring preliminary magnetic resonance data from an imaging zone. The method comprises controlling the magnetic resonance imaging system with preparation pulse sequence commands to acquire a first data portion and a second data portion of the preliminary magnetic resonance data. The preparation pulse sequence commands are configured for controlling the magnetic resonance imaging system to generate a first bipolar readout gradient during the acquisition of the first data portion. The preparation pulse sequence commands are configured for controlling the magnetic resonance imaging system to generate a second bipolar readout gradient during acquisition of the second data portion. The first bipolar readout gradient has an opposite polarity to the second bipolar readout gradient.

The method further comprises calculating a measured normalised phase correction quantity in image space using the first data portion and the second data portion. The method further comprises fitting a model phase correction term to the measured phase error. The model phase correction is a phasor of a phase error function. The phase error function is spatially dependent. The phase error function may be a predetermined parametrised function of which optimal values for the parameters may be obtained by fitting to the phase errors in the measured MR data.

In another aspect the invention provides for a computer program product comprising machine-executable instructions for execution by a processor configured for controlling the magnetic resonance imaging system to acquire preliminary magnetic resonance data from an imaging zone. Execution of the machine-executable instructions causes the processor to control the magnetic resonance imaging system with preparation pulse sequence commands to acquire a first data portion of the preliminary magnetic resonance data and a second data portion of the preliminary magnetic resonance data. The preparation pulse sequence commands are configured for controlling the magnetic resonance imaging system to generate a first bipolar readout gradient during acquisition of the first data portion. The preparation pulse sequence commands are configured for controlling the magnetic resonance imaging system to generate a second bipolar readout gradient during acquisition of the second data portion. The first bipolar readout gradient has an opposite polarity to the second bipolar readout gradient.

Execution of the machine-executable instructions further causes the processor to calculate a measured normalised phase correction quantity in image space using the first data portion and the second data portion. Execution of the machine-executable instructions further cause the processor to fit a model phase error function to the measured phase error. The model phase correction is phasor of the phase error function. The phase error function is spatially dependent. The phase error function may be a predetermined parametrised function of which optimal values for the parameters may be obtained by fitting to the phase errors in the measured MR data.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage may be any volatile or non-volatile computer-readable storage medium.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Preliminary magnetic resonance data is an example of medical imaging data. A Magnetic Resonance (MR) image is defined herein as being the reconstructed two or three dimensional visualization of anatomic data contained within the magnetic resonance imaging data.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
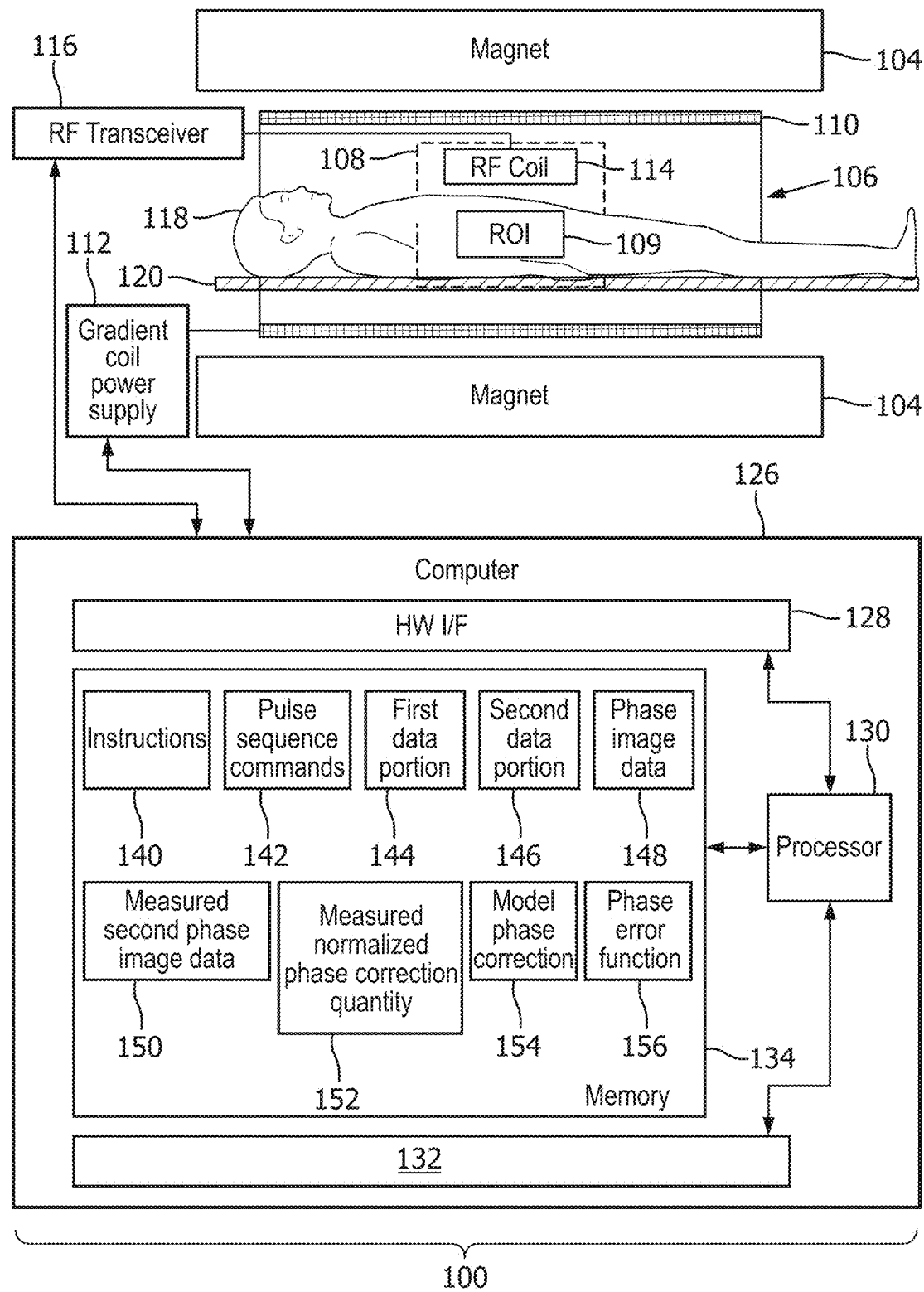
FIG. 1 illustrates an example of a magnetic resonance imaging system.

FIG. 1 shows an example of a magnetic resonance imaging system 100 with a magnet 104. The magnet 104 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging. A region of interest 109 is shown within the imaging zone 108. A subject 118 is shown as being supported by a subject support 120 such that at least a portion of the subject 118 is within the imaging zone 108 and the region of interest 109.

Within the bore 106 of the magnet there is also a set of magnetic field gradient coils 110 which is used for acquisition of preliminary magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels. For example if a parallel imaging technique such as SENSE is performed, the radio-frequency could 114 will have multiple coil elements.

The transceiver 116 and the gradient controller 112 are shown as being connected to a hardware interface 128 of a computer system 126. The computer system further comprises a processor 130 that is in communication with the hardware system 128, a memory 134, and a user interface 132. The memory 134 may be any combination of memory which is accessible to the processor 130. This may include such things as main memory, cached memory, and also non-volatile memory such as flash RAM, hard drives, or other storage devices. In some examples the memory 130 may be considered to be a non-transitory computer-readable medium.

The memory 134 is shown as containing machine-executable instructions 140 that enable the processor 130 to send and receive commands in order to control the operation and function of the magnetic resonance system 100. The computer memory 134 is further shown as containing preparation pulse sequence commands 142. The preparation pulse sequence commands are either commands or are data or meta data which may be used to generate commands for controlling the magnetic resonance imaging system 100 to acquire preliminary magnetic resonance data. The storage 134 is further shown as containing a first data portion 144 and a second data portion 146 which make up preliminary magnetic resonance data that is acquired by using the preparation pulse sequence commands 142. The preparation pulse sequence commands 142 are configured for controlling the magnetic resonance imaging system to generate a first bipolar readout gradient during acquisition of the first data portion 144. The preparation pulse sequence commands 142 are configured for controlling the magnetic resonance imaging system to generate a second bipolar readout gradient during acquisition of the second data portion 144. The first bipolar readout gradient has an opposite polarity to the second bipolar readout gradient.

The memory 134 is shown as having a measured first phase image data 148 that has been reconstructed from the first data portion 144. The memory 134 is further shown as containing a measured second phase image data 150 that was reconstructed from the second data portion 146. The memory 134 is further shown as containing a measured normalised phase correction quantity 152 that was calculated using the data in the phase image data 148 and 150. The memory 134 is further shown as containing a model phase error function 154. The model phase correction 154 was calculated by fitting an to a phasor of the phase error function 156. The phase error function is also shown as being stored in the memory 134.

Figure 2:
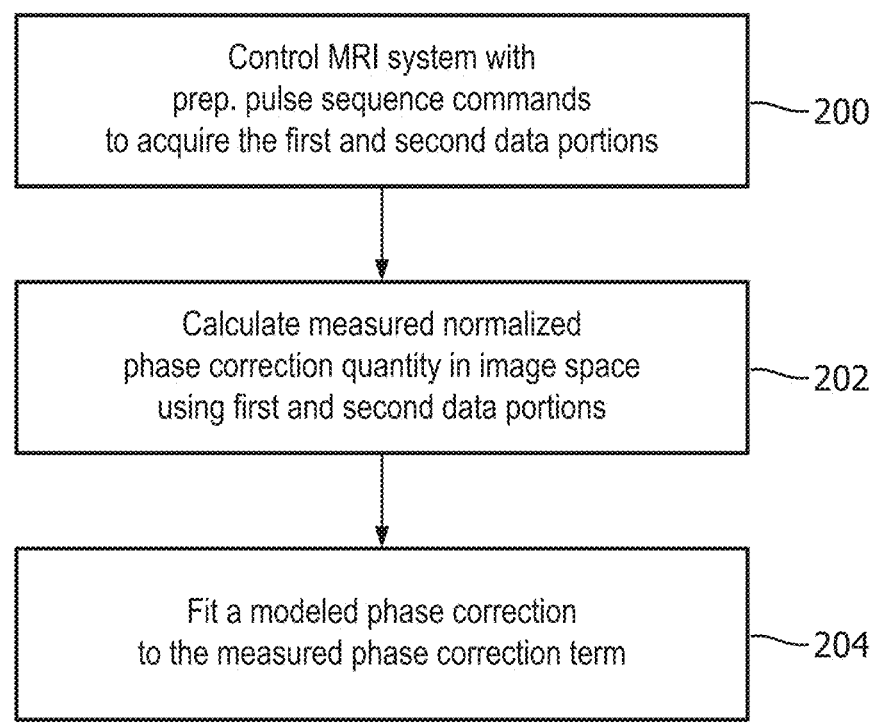
FIG. 2 shows a flow chart which illustrates a method of operating the magnetic resonance imaging system of FIG. 1.

FIG. 2 shows a flow diagram which illustrates a method of operating the magnetic resonance imaging system 100 of FIG. 1. First in step 200 the magnetic resonance imaging system 100 is controlled with the preparation pulse sequence commands 142. The preparation pulse sequence commands are used to control the magnetic resonance imaging system 100 to acquire the first data portion 144 and the second data portion 146. Next in step 202 the measured normalised phase correction quantity 152 is calculated using the measured first phase image data 148 and the measured second phase image data 150. Finally, in step 204 a model phase correction 154 is fit to the measured normalised phase correction quantity 152. In the course of the fitting process the phase error function 156 is generated.

The Dixon method is becoming of increasing importance for the separation of water and fat and for the determination of fat fractions. Both FFE and TSE methods are in use and the technique is used for various anatomies.

In Dixon scans, artifacts may arise for sequences with alternating gradients due to the fact that eddy current related phases along the readout direction are incorrectly compensated. The errors arise from imperfect processing of noisy data with rapid phase variations including phase wraps. These artifacts should be reduced or eliminated.

The artefacts mentioned above are currently addressed by a method using preparation phase data that is acquired for $k_y=k_z=0$. (Projection of the volume on the x-axis.) The data is processed including spatial smoothing and a phase unwrapping algorithm. This combination may fail in cases with rapid phase variations.

A bit more detailed background is now given, in order to appreciate the invention: In Dixon processing, a so-called 1D phase correction is applied first in the whole processing sequence. The preparation phase data used for deriving the phase correction consist of two data vectors, measured with opposed gradient polarity. This is done for each echo.

The aim of the phase correction is to remove the spatially smooth component of the phase error due to the gradient chain. The 1D model of the data is as follows:

$$p_c^+(x) = p_c(x)e^{j\phi(x)}$$

$$p_c^-(x) = p_c(x)e^{-j\phi(x)}, \quad (0.1)$$

where $\phi(x)$ denotes the spatially dependent phase error. For negative gradients this is assumed to be opposed with respect to sign to that of positive gradients. The subscript c denotes channel. The superscripts +/− denote positive or negative readout gradient. The double phase correction term can therefore be obtained from:

$$\langle p_{2corr}(x) \rangle = \sum_c \frac{p_c^-(x) p_c^{+*}(x)}{|p_c^+(x)|} \quad (0.2)$$

According to the model, the phase estimate should be the same for each channel. Due to spatial variations and noise the estimate is more robust by averaging over all channels. Note that $p_{2corr}$ contains double the phase correction term $\phi_{corr}(x) = -\phi(x)$. To derive $\phi_{corr}(x)$ itself, a division of the phase by two is required. A conventional algorithm would apply a phase unwrapping algorithm. It might also remove a linear phase component first and apply spatial smoothing before doing the unwrapping. However this only works when the SNR of the data is good enough and the spatial variations of the phase are sufficiently smooth. These assumptions may not hold. An example is shown below, in FIGS. 3 through 6.

Figure 3:
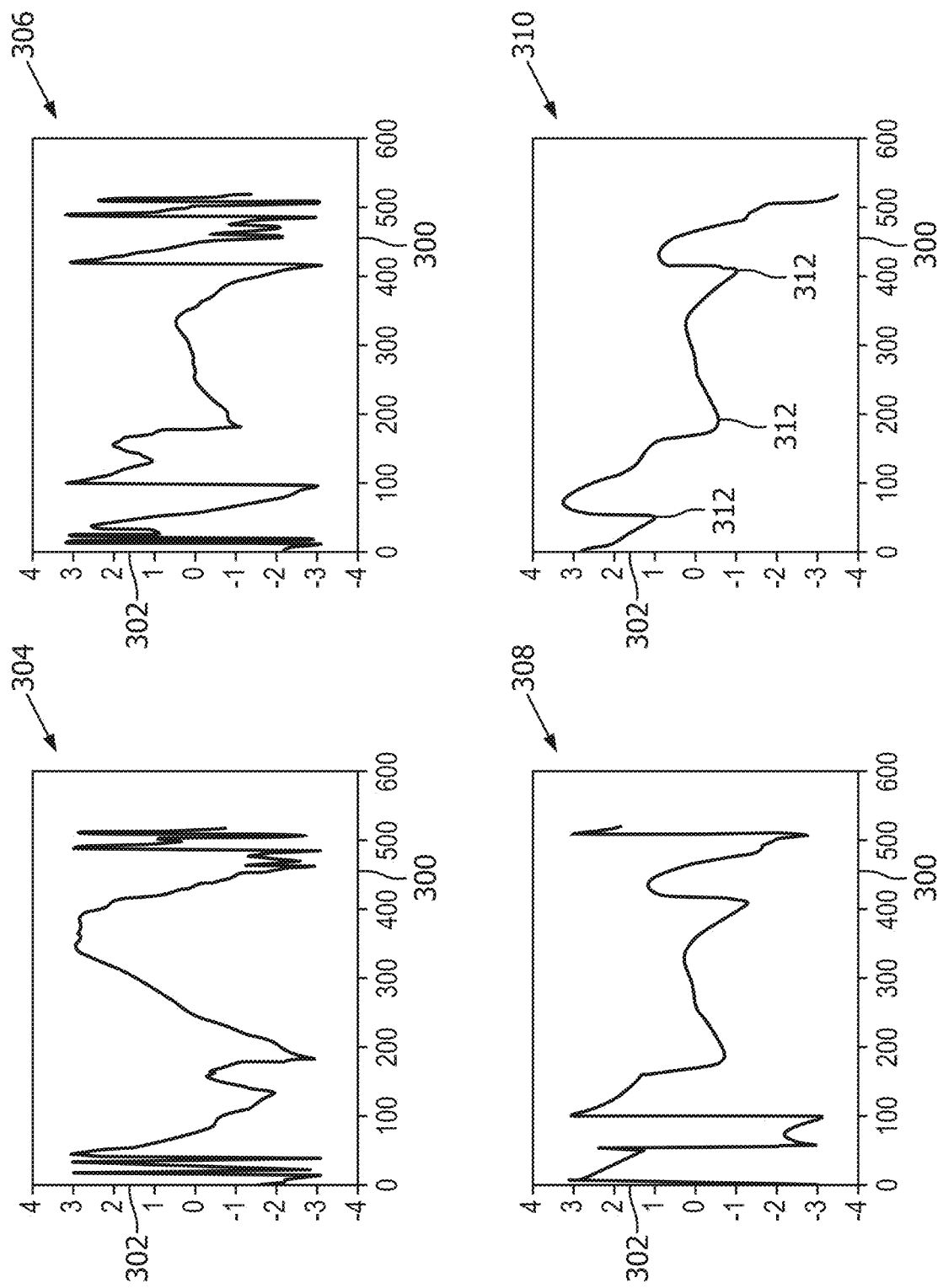
FIG. 3 shows several plots of phase versus position.

FIG. 3 shows four plots. The four plots are plots of position 300 versus phase 302. Plot 304 shows a plot of the double phase correction as would be calculated with equation 0.2. Next plot 306 shows plot 304 after an estimation removal of the linear phase component has been performed. Plot 308 shows the phase data after a spatial smoothing. Plot 310 shows the phase after phase unwrapping 310. It can be seen in this Fig. that the phase unwrapping has likely been improperly performed and there are a number of line artefacts 312. The sharp transitions or line artifacts 312 in the processed phase give rise to ugly line artifacts (and some water fat swaps) as shown in FIGS. 4 and 5 below.

Figure 4:
FIG. 4 shows an example of a magnetic resonance image.
Figure 5:
FIG. 5 shows a further example of a magnetic resonance image.
Figure 6:
FIG. 6 shows a further example of a magnetic resonance image.

FIGS. 4, 5 and 6 show several images from a Dixon magnetic resonance imaging protocol. FIG. 4 shows a water image when the standard method of processing is applied. Lines and water-fat swabs can be seen. The regions labeled 400 are where the phase has not been properly calculated and there are abnormally bright regions. FIG. 5 shows FIG. 4 after it has been processed such that linear phase removal and spatial smoothing is left out in the 1D phase correction procedure. FIG. 6 shows a water image calculated using the same data as is in FIGS. 4 and 5. In this case the procedure has been followed according to an example where the phase error function is a third order polynomial. It can be seen that the large number of water and fat swab regions 400 is not present in FIG. 6. The phase error function in FIG. 6 has been calculated properly.

Examples may have an algorithm that estimates a smooth phase curve, described by, for example, a 3rd order polynomial that is derived from the same raw echo phase data, while avoiding phase wraps and other incorrect phase related artifacts. The algorithm works by fitting a synthetic phasor function to the measured phasor function. Using a phasor formulation intrinsically covers the phase wraps. No explicit phase unwrapping is required. The spanning up of the phase with a spatially smooth function ensures a smooth correction of the input data.

Description of how to build and use an example:

The phase is modeled as a polynomial function of the readout direction x:

$$\phi(x) = a_n x^n + La_2 x^2 + a_1 x + a_0. \quad (0.3)$$

The corresponding synthetic phasor function is $$z(x) = e^{j\phi(x)}. \quad (0.4)$$

The polynomial coefficients a are determined by fitting the phasor function z to the measured phasor function y(x), which is derived from $p_{2corr}(x)$, see equation (0.2):

$$y(x) = \frac{p_{2corr}(x)}{|p_{2corr}(x)|}. \quad (0.5)$$

So the coefficients are found through the solution of a minimization problem:

$$a = \operatorname*{argmin}_{a}\left(\sum_i |y(x_i) - e^{j\phi(x_i)}|^2\right), \quad (0.6)$$

With a the vector containing the coefficients $a_j$. In other examples, any desired order for the polynomial function can be chosen. Typically, it will be relative small, three, say. Of course any other suitable smooth function, described by a small set of parameters can be chosen.

In principle, a global optimization problem should be used for solving the minimization problem in order to avoid local minima in the objective function. For practical purposes local optimization algorithms can also be used when measures are taken to avoid local minima. Such a measure can for example consist of repeatedly solving an optimization problem where the phase is fitted first on a limited (centre) part of the field of view and the field of view is gradually expended in subsequent minimizations to cover the whole field of view. Also the flexibility (order of the polynomial) of the modeling function can gradually be increased.

A further refinement is to use an amplitude weighting in problem (0.6) to give less weight to samples that give unreliable phase information. Also, not necessarily a least squares problem needs to be solved. Another suitable power can be used as well. The problem is then reformulated as:

$$a = \operatorname*{argmin}_{a}\left(b(x_i)\sum_i |y(x_i) - e^{j\phi(x_i)}|^p\right), \quad (0.7)$$

With b(x) the amplitude function and p the power.

Figure 7:
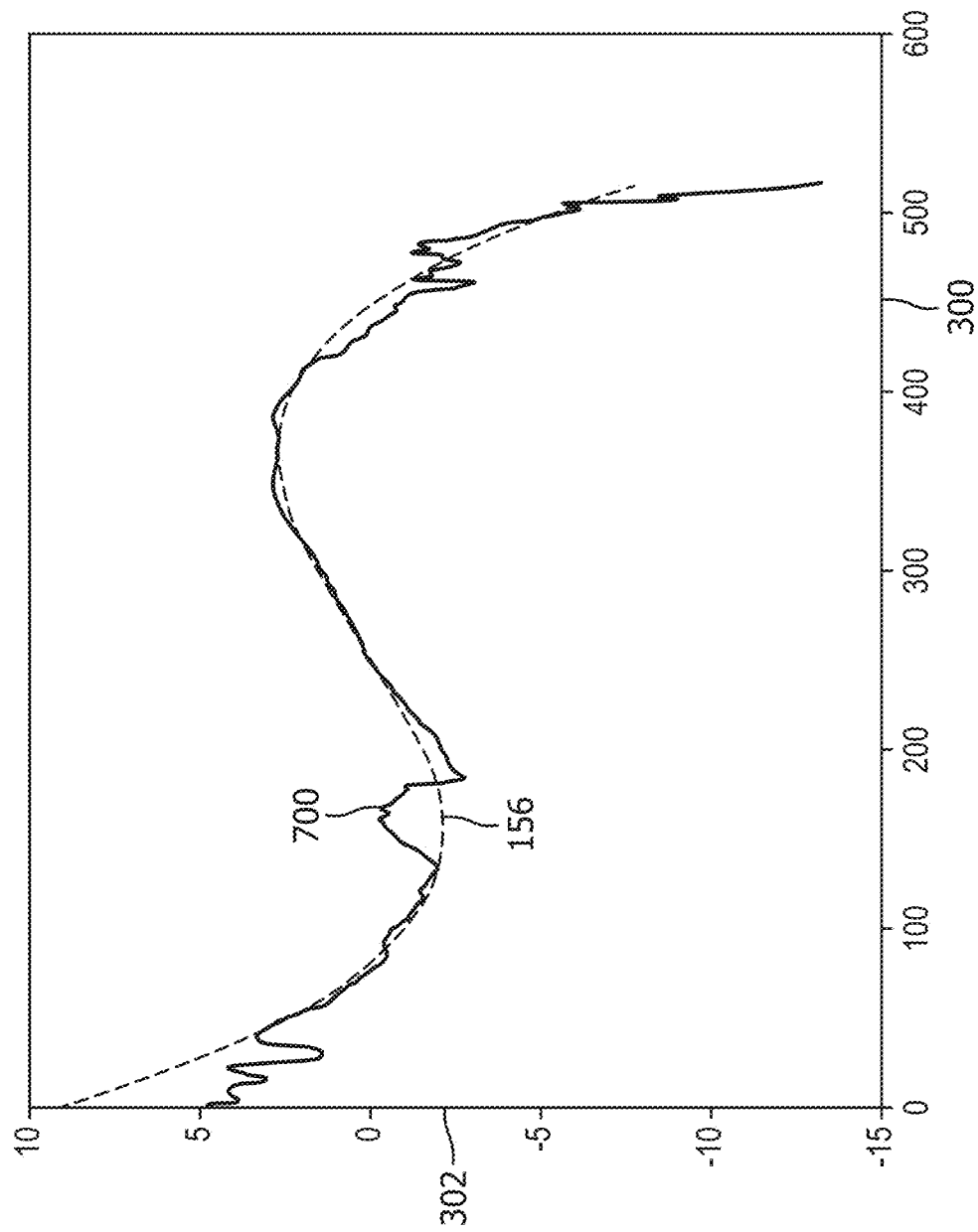
FIG. 7 shows a plot which shows a phase error function calculated according to an example.

An example corresponding to the data set above is shown in FIG. 7, below. This example is for echo 2. Echo 1 is processed with the same algorithm. When the fitted phases are used for phase correction, the Dixon processing yields the water image in the bottom left part of FIG. 6. The line artefacts are all gone. The corresponding B0 map (not shown) is fairly smooth.

FIG. 7 shows a plot of position versus the phase 302. In FIG. 7 a plot of the phase error function 156 calculated according to an example is compared to a conventional phase error function 700. For example this could be calculated in a Dixon magnetic resonance imaging procedure. The phase error function 156 was obtained by fitting the model phase error function 154 to the measured normalised phase correction quantity 152 which corresponds to the plot 304 in FIG. 3. The curve 700 is the phase error obtained through a straight forward phase unwrapping procedure. In this case it is believed to be correct and the curve 156 follows it quite accurately. The deviations at the edge correspond to low amplitude areas where the phase correction data is not reliable.

Examples can also be applied to any similar problem where two data sets are compared with each other in phase, and where half the phase difference is required in the end. An example is EPI phase correction.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
109 region of interest
110 magnetic field gradient coils
112 magnetic field gradient coil power supply
114 radio-frequency coil
116 transceiver
118 subject
120 subject support
126 computer system
128 hardware interface
130 processor
132 user interface
134 computer memory
140 machine executable instructions
142 pulse sequence commands
144 first data portion
146 second data portion
148 measured first phase image data
150 measured second phase image data
152 measured phase error
154 modeled phase error function
156 phase error function 200 control the magnetic resonance imaging system with the preparation pulse sequence commands to acquire the first data portion and the second data portion 202 calculate a measured normalised phase correction quantity in image space using the first data portion and the second data portion 204 fit a modeled phase correction to the measured phase correction term, wherein the modeled phase correction is an exponential of a complex value multiplied by a phase error function, wherein the phase error function is spatially dependent 300 position 302 phase 304 plot of double phase correction term 306 phase after estimation and removal of a linear phase component 308 phase data after spatial smoothing 310 phase after phase unwrapping 312 line artifacts 400 water/fat swap regions 700 conventional phase error function

The invention claimed is:

1. A method of operating a magnetic resonance imaging system for acquiring preliminary magnetic resonance data from an imaging zone, wherein the method comprises:
controlling the magnetic resonance imaging system with preparation pulse sequence commands to acquire a first data portion of the preliminary magnetic resonance data and a second data portion of the preliminary magnetic resonance data, wherein the preparation pulse sequence commands are configured for controlling the magnetic resonance imaging system to generate a first bipolar readout gradient during acquisition of the first data portion, wherein the preparation pulse sequence commands are configured for controlling the magnetic resonance imaging system to generate a second bipolar readout gradient during acquisition of the first data portion, wherein the first bipolar readout gradient has an opposite polarity to the second bipolar readout gradient;
calculating a measured normalised phase correction quantity in image space using the first data portion and the second data portion; and
fitting a modeled normalised phase correction quantity to the measured normalised phase correction quantity, wherein the modeled normalised phase correction quantity is an exponential of a complex value multiplied by a phase error function, wherein the phase error function is spatially dependent.

2. A magnetic resonance imaging system for acquiring preliminary magnetic resonance data from an imaging zone, wherein the magnetic resonance imaging system comprises:
a memory for storing machine executable instructions and preparation pulse sequence commands, wherein the preparation pulse sequence commands are configured for acquiring the preliminary magnetic resonance data as a first data portion and a second data portion, wherein the preparation pulse sequence commands are configured for controlling the magnetic resonance imaging system to generate a first bipolar readout gradient during acquisition of the first portion, wherein the preparation pulse sequence commands are configured for controlling the magnetic resonance imaging system to generate a second bipolar readout gradient during acquisition of the second portion, wherein the first bipolar readout gradient has an opposite polarity to the second bipolar readout gradient; and
a processor for controlling the magnetic resonance imaging system, wherein execution of the machine executable instructions causes the processor to:
control the magnetic resonance imaging system with the preparation pulse sequence commands to acquire the first data portion and the second data portion;
calculate a measured normalised phase correction quantity representing a phase error in the data portions in image space using the first data portion and the second data portion; and
fit a modeled phase correction to the measured normalised phase correction quantity, wherein the modeled phase correction is a phasor of a predetermined spatially dependent phase error function.

3. The magnetic resonance imaging system of claim 2, wherein execution of the machine executable instructions further causes the processor to:
reconstruct measured first phase image data using the first data portion; and
reconstruct measured second phase image data using the second data portion, wherein the measured first phase image data is equal to corrected first phase image data multiplied by the measured phase error,
wherein the measured second phase image data is equal to corrected second phase image data multiplied by the complex conjugate of the measured phase error,
wherein measured normalised phase correction quantity is calculated from the measured first phase image data and the measured second phase image data and phase correction resulting from the fit.

4. The magnetic resonance imaging system of claim 3, wherein the magnetic resonance imaging system comprises a multiple channel radio-frequency system comprising multiple channels for receiving the preliminary magnetic resonance data, wherein the measured normalised phase correction quantity is calculate from an average of each of the multiple channels.

5. The magnetic resonance imaging system of claim 2, wherein execution of the machine executable instructions further cause the processor to:
reconstruct a first phase image using the first data portion and
reconstruct a second phase image using the second data portion;
wherein the measured normalised phase correction quantity is calculated using the first phase image and the second phase image.

6. The magnetic resonance imaging system of claim 2, wherein the magnetic resonance imaging system comprises a multiple channel radio-frequency system comprising multiple channels for receiving the magnetic resonance imaging system using the multiple receive channels, wherein execution of the machine executable instructions further causes the processor to:
reconstruct a first phase image using the first data portion for each of the multiple channels;
reconstruct a second phase image using the second data portion for each of the multiple channels; and
calculating a channel normalised phase correction quantity using the first phase image and the second phase image for each of the multiple channels;
wherein the measured normalised phase correction quantity is calculated using an average of the channel normalised phase correction quantity form for each of the multiple channels.

7. The magnetic resonance imaging system of claim 2, wherein the memory further comprises imaging magnetic resonance commands, wherein the imaging magnetic resonance commands are configured for acquiring imaging magnetic resonance data according to a Dixon magnetic resonance imaging protocol, wherein execution of the machine executable instructions further cause the processor to acquire imaging magnetic resonance data using the imaging sequence commands, wherein execution of the machine executable instructions further causes the processor to reconstruct at least a water image and a fat image according to the Dixon magnetic resonance imaging protocol using the imaging magnetic resonance data, wherein reconstructing the water image and the fat image comprises calculating a phase correction using the phase error function.

8. The magnetic resonance imaging system of claim 2, wherein the memory further comprises imaging magnetic resonance commands, wherein the imaging magnetic resonance commands are configured for acquiring imaging magnetic resonance data according to an Echo planar imaging magnetic resonance imaging protocol or a diffusion weighted imaging magnetic resonance imaging protocol, wherein execution of the machine executable instructions further causes the processor to reconstruct a magnetic resonance image using the imaging magnetic resonance data, wherein reconstructing the magnetic resonance image comprises calculating a phase correction using the phase error function.

9. The magnetic resonance imaging system of claim 2, wherein a bipolar readout gradient comprises a pulse train comprising the first data portion associated with the first bipolar readout gradient and the second data portion associated with the second bipolar readout gradient multiple times, wherein the phase error function is calculated as an average over the pulse train.

10. The magnetic resonance imaging system of claim 2, wherein phase error function is real valued, and wherein the phase error function is continuous.

11. The magnetic resonance imaging system of claim 10, wherein the phase error function has a continuous first derivative.

12. The magnetic resonance imaging system of claim 2, wherein the phase error function is a polynomial function.

13. The magnetic resonance imaging system of claim 2, wherein the preparation pulse sequence commands are configured for causing the magnetic resonance imaging system to generate the first bipolar gradient and the second bipolar gradient in a read out direction, wherein the phase error function is calculated at least as a function of the readout direction.

14. The magnetic resonance imaging system of claim 2, wherein the phase error function is a multi-dimensional function.

15. A computer program product comprising machine executable instructions for execution by a processor configured for controlling a magnetic resonance imaging system to acquire preliminary magnetic resonance data from an imaging zone, wherein execution of the machine executable instructions causes the processor to: control the magnetic resonance imaging system with preparation pulse sequence commands to acquire a first data portion of the preliminary magnetic resonance data and a second data portion of the preliminary magnetic resonance data, wherein the preparation pulse sequence commands are configured for controlling the magnetic resonance imaging system to generate a first bipolar readout gradient during acquisition of the first data portion, wherein the preparation pulse sequence commands are configured for controlling the magnetic resonance imaging system to generate a second bipolar readout gradient during acquisition of the second data portion, wherein the first bipolar readout gradient has an opposite polarity to the second bipolar readout gradient;

calculate a measured normalised phase correction quantity in image space using the first data portion and the second data portion; and fit a modeled phase correction to the measured normalized phase correction quality, wherein the modeled phase correction is an exponential of a complex value multiplied by a phase error function, wherein the phase error function is spatially dependent.

* * * * *